United States Patent [19]

Holtslander

[11] Patent Number: 4,618,817

[45] Date of Patent: Oct. 21, 1986

[54] MULTIPLE PHASE SWITCHING CIRCUIT AND HEAT SINK STRUCTURE

[75] Inventor: Roger A. Holtslander, Mt. Clemens, Mich.

[73] Assignee: Wolf Engineering Corporation, Dearborn, Mich.

[21] Appl. No.: 775,152

[22] Filed: Sep. 12, 1985

[51] Int. Cl.[4] .................. G05F 1/44; H05K 7/20
[52] U.S. Cl. ..................... 323/322; 323/319; 323/910; 361/386; 361/427; 363/144
[58] Field of Search ............... 323/235, 239, 241, 319, 323/322, 324, 910, 902; 363/141, 144; 361/386–388, 427, 429

[56] References Cited

U.S. PATENT DOCUMENTS

| | | |
|---|---|---|
| 3,050,611 | 8/1962 | Kamide . |
| 3,154,695 | 10/1964 | MacGregor et al. . |
| 3,200,296 | 8/1965 | Bruestle . |
| 3,319,152 | 5/1967 | Pinckaers . |
| 3,566,151 | 2/1971 | Wilburn . |
| 3,671,849 | 6/1972 | Kingston . |
| 3,696,288 | 10/1972 | Carman ..................... 323/910 X |
| 3,752,956 | 8/1973 | Cahill et al. . |
| 3,764,890 | 10/1973 | Caen . |
| 3,780,318 | 12/1973 | Werts et al. . |
| 3,816,763 | 6/1974 | Korn et al. . |
| 3,821,516 | 6/1974 | Hayes et al. . |
| 3,846,824 | 11/1974 | Bell . |
| 3,855,452 | 12/1974 | Flasza et al. . |
| 3,881,091 | 4/1975 | Day . |
| 3,940,634 | 2/1976 | Grogan ..................... 323/319 X |
| 4,072,880 | 2/1978 | Oshima et al. ............ 323/910 X |
| 4,158,150 | 6/1979 | Dever . |
| 4,167,696 | 9/1979 | Gyursanszky . |
| 4,172,272 | 10/1979 | Schneider ..................... 361/386 |
| 4,176,288 | 11/1979 | Komatsu et al. . |
| 4,223,207 | 9/1980 | Chow . |
| 4,243,894 | 1/1981 | Kuntner et al. . |
| 4,344,106 | 8/1982 | West et al. . |
| 4,382,271 | 5/1983 | Villemont et al. . |
| 4,424,439 | 1/1984 | Payne et al. . |

Primary Examiner—Peter S. Wong
Attorney, Agent, or Firm—Harness, Dickey & Pierce

[57] ABSTRACT

A multiple phase electricity switching apparatus having electrical components arranged and mounted on a heat sink structure which having the same external dimensions as a conventional electromagnetic relay. The switching apparatus controls the amount of electrical energy passing therethrough and into electrical resistance heating elements thereby controlling the temperature of the molten plastic raw materials. The switching apparatus includes a pair of inverse parallel connected SCR's (silicon control rectifier), a photo coupling, and a zero cross switching circuit. The SCRs are separately mounted on and separated by a structure having two parallel members. The electronic circuit components permit the electrical power supplied to the load to be switched more frequently thereby realizing improved temperature regulation.

7 Claims, 5 Drawing Figures

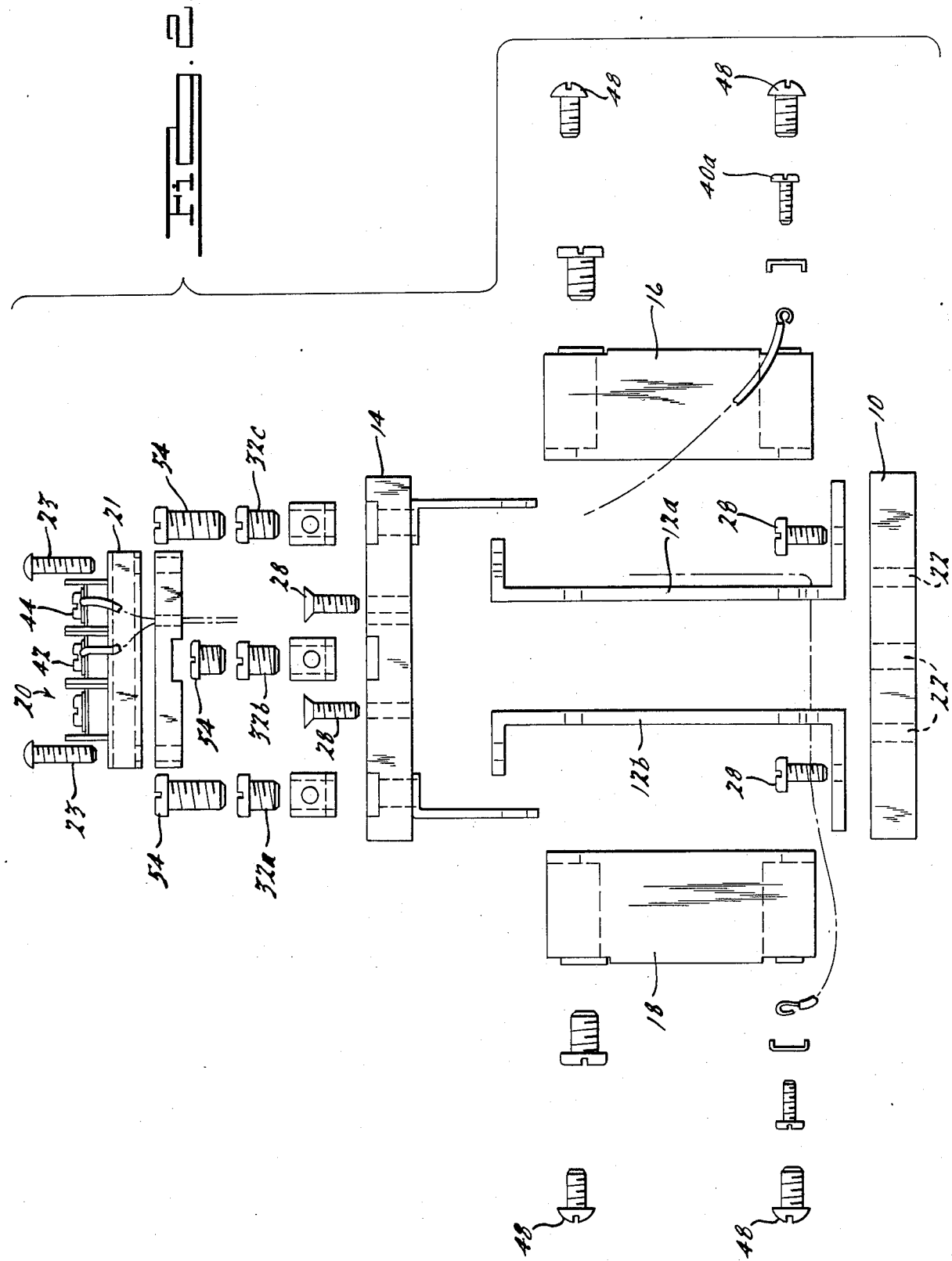

MULTIPLE PHASE SWITCHING CIRCUIT AND HEAT SINK STRUCTURE

TECHNICAL FIELD

The present invention relates to a circuit and a structure for mounting the components of the circuit. More particularly, the present invention relates to a circuit for switching three-phase power and a heat sink structure for mounting components of the circuit in an arrangement which fits within the dimensions defined by a conventional electromagnetic relay which the present invention replaces.

BACKGROUND

Industrial plastic processing machines utilize multiphase electricity as an energy source to generate heat for melting and/or maintaining plastic in a molten state. The electricity is converted into thermal energy by electrical resistance heating elements which are located on a molten plastic vessel associated with the molding machine. The temperature of the molten plastic is controlled by selectively turning on and off the electrical power supply to the electrical resistance heating elements. In conventional industrial plastic processing machines the electrical power is switched on and off by electromagnetic relays having mechanical contacts. Each phase of the electrical supply is switched by individual pairs of contacts. Heat control using electromagnetic relays is capable of reliably maintaining molten plastic at a temperature range of minus zero, plus 7° F. Operating in such a temperature range, the relays are cycled approximately once per minute. To realize more accurate temperature control, the relays must be cycled on and off more frequently. For example, minus zero, plus 1° F. temperature regulation may be realized if the relays are cycled approximately once per second. Such high frequency relay cycling raises the operating temperature of the relay contacts and reduces the life of the contacts. Failure of the contacts results in a loss of conduction of electrical energy. Typically, contact failure occurs in individual phases and not in all phases at one time. With conventional electromagnetic equipment, loss of conduction of a single phase can be discovered only by individual examination of each contact. When a phase loss condition occurs, the remaining phases must pick up the heating load as required to meet thermostatic demand conditions. As a result, the molten plastic material surrounded by the operating electrical resistance elements is overheated and the molten plastic surrounded by the non-operating electrical resistance elements is underheated. Such uneven heating of the plastic reduces the structural and dimensional quality of products formed therefrom. In addition, the remaining operating phases must handle a greater load. This added load shortens the life of the remaining phases.

Efforts to replace the conventional electromagnetic relays with electronic components which are capable of high frequency switching for extended periods of time are limited by the fact that the space available for retrofit mounting of such a circuit within the conventional electrical panel is extremely restricted. Locating the circuit in a remote panel is effective but requires an extra panel box and remote wiring. Many remote circuits also utilize electromagnetic contacts to engage the electronic switching components in each phase and are susceptible to mechanical failure and possible phase loss operation.

The present invention features a heat sink structure on which the electronic components required for switching may be mounted in an arrangement having the same dimensions as that of the conventional electromagnetic relay. Therefore, no additional remote panel is required. The present invention includes an electronic circuit having two pair of inverse parallel connected silicon control rectifiers connected in two phases and a silicon control rectifier switching circuit. The switching circuit includes a first portion which converts the conventional logic signal into one acceptable to the SCR's. The second portion of the switching circuit includes a photo isolation coupling and a zero cross switching circuit in association with each pair of inverse parallel connected silicon control rectifiers.

The first portion of the switching circuit is connected to the photo isolation couplings of the second portion in a parallel circuit arrangement. Such a circuit arrangement disables the entire circuit if the first portion of the triggering circuit or either photo isolation coupling fails thereby preventing operation in a lost phase condition.

The photo isolation coupling prevents any electrical disturbance from being communicated from the electrical switching portion to the logic source. The zero cross switching circuit holds the logic signal until the instantaneous value of the amplitude of the supply voltage in the respective phase is zero and then releases the signal to switch the respective silicon control rectifier. Switching the silicon control rectifiers as the power supply voltage crosses zero minimizes the strain thereby maximizing the life of the silicon control rectifiers.

Additional objects and advantages of the present invention will become apparent by reading the detailed description of the preferred embodiment which makes reference to the following set of drawings.

BRIEF DESCRIPTION OF THE DRAWINGS

FIG. 2 is an exploded side view of the heat sink structure of FIG. 1 and associated electrical components;

FIG. 5 is a part flow diagram part circuit diagram of the circuit of the present invention.

DESCRIPTION OF THE PREFERRED EMBODIMENT

Figure 1:
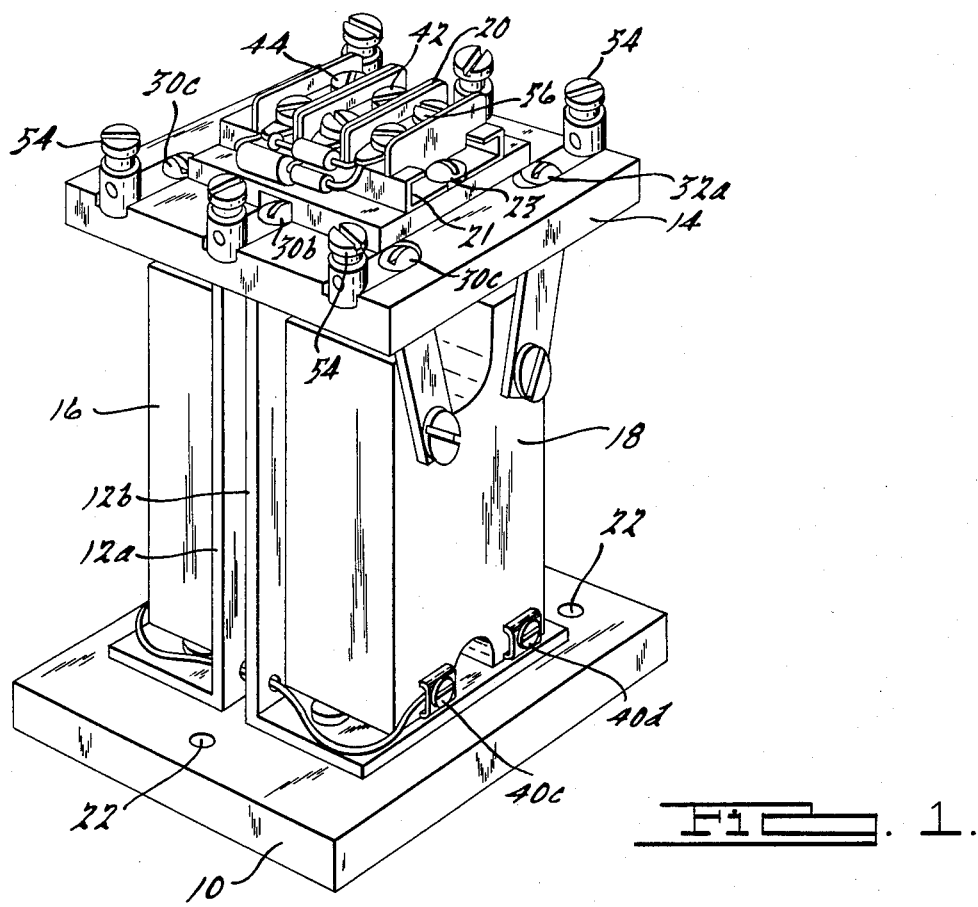
FIG. 1 is a perspective view of the heat sink structure with electrical circuit components mounted thereon.

Referring now to the drawings, particularly FIGS. 1 and 2, the apparatus of the present invention is shown having structural elements including a base 10, upright members 12a and 12b and a top member 14 with electrical components mounted thereon including silicon controlled rectifier "SCR" modules 16 and 18 and logic conditioning module 20. Logic conditioning module 20 is secured to top member 14 by mounting brackets 21 and fasteners 23. The SCR modules used are a CRYDOM D2440 solid state relay. The base 10 is constructed of aluminum or a suitably strong heat conductive material. The base 10 has mounting holes 22 which define a pattern that is interchangeable with the mounting pattern defined by a conventional electromagnetic relay (not shown) which the apparatus of the present invention replaces. The upright members 12a and 12b are constructed of aluminum or a suitably strong heat conductive material. The upright members 12a and 12b have flange portions which mate with the bottom member 10 and the top member 14 and are secured thereto by fasteners 29. The upright members 12a and 12b may be formed by extrusion or by a press brake operation. The top member 14 is constructed of glass phenolic or a similar electrical insulating material. The supply terminals 30 and load terminals 32 are secured to the top member 14 by fasteners 34. The surface of the top member is routed in a pattern which defines a recess in which the supply terminals 30 and load terminals 32 are secured. SCR modules 16 and 18 are secured to opposing sides of the upright members 12a and 12b by fasteners 48. Each SCR module 16 and 18 has two pairs of electrical connections. A first pair of electrical connections, indicated as terminal connection 40, is connected to the logic command conditioning module terminals in the following manner: terminal 44 of the logic conditioning module 20 is connected to terminal 40a of the SCR module 16, terminal 40b of the SCR module 16 is connected to 18 terminal 40c of the SCR module, terminal 40d of the SCR module 18 is then connected to terminal 42 of the logic command conditioning module 20. This completes a parallel connection of the first portion of the SCR switching circuit. Each SCR module 16 and 18 has a second pair of electrical connections 48a, 48b, 48c and 48d for connection with the electrical power supply and the load in the following manner: The electrical power supply is connected to terminals 48a and 48c of SCR modules 16 and 18 respectively. The electrical load is connected to terminals 48b and 48d of SCR modules 16 and 18 respectively. The electrical connection between the logic command conditioning module and respective SCR terminals is completed by using an 18 gauge multistrand insulated wire. The electrical connection between the supply terminals 30a, 30b, 30c, load terminals 32a, 32b, 32c and respective SCR terminals is completed by using a 12 gauge multistrand insulated wire. Supply terminal 30c and load terminal 32c are connected by 12 gauge multistrand insulated wire. All electrical connections include swagged eyelet type terminal connectors. The openings are provided in top member 14 suitably located to permit the wires to pass therethrough. Terminal connections 30a, 30b, 30c and 32a, 32b, 32c secured to top member 14 permit the embodiment of the present invention to be disconnected from the electrical supply and the electrical load by removing fasteners 54 and disengaging the respective electrical connections (not shown). The logic conditioning module 20 has terminal connection 56 which is connected to and receives a signal from an external logic source.

Figure 4:
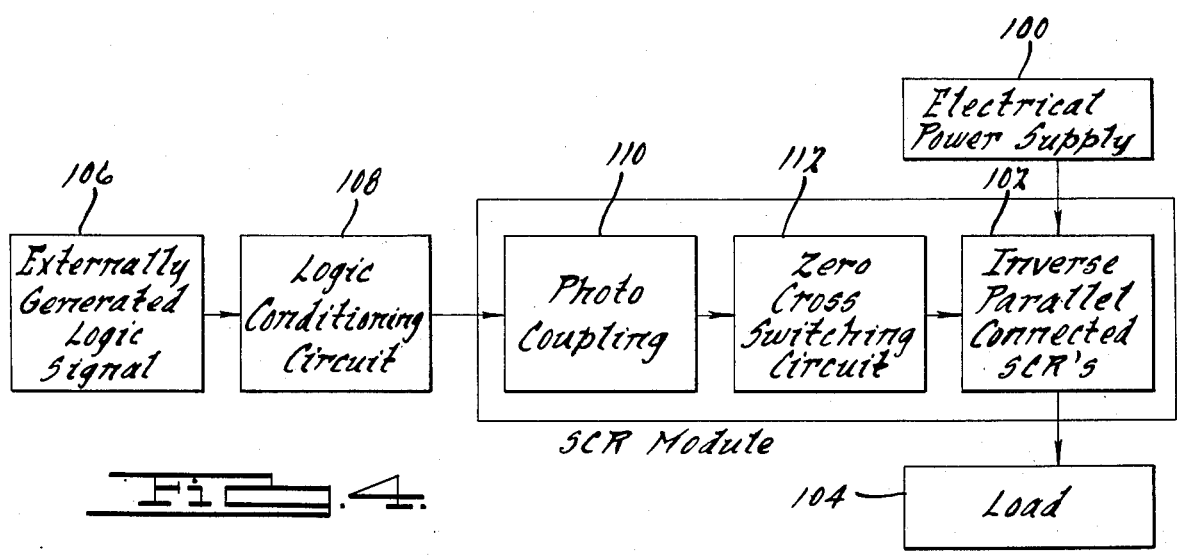
FIG. 4 is a flow diagram of the circuitry of the present invention.

Referring now to FIG. 4, the flow diagram of electronic functions of the present invention is shown. The electrical power supply 100 is connected to the SCR module 101 which includes a pair of inverse parallel connected SCRs 102 which are then connected to the load 104. The externally generated logic signal 106 is connected to a logic conditioning cirucit 108 which is then connected via a photo coupling 110 to a zero cross switching circuit 112. The zero cross-over switching circuit is then connected to the inverse parallel connected SCRs 102.

Referring to FIG. 5, a partial block diagram and partial circuit diagram is shown. The embodiment of the present invention includes a three-pahase electrical supply 100 connected to a resistive load 104. Two SCR modules 16 and 18 are connected between the electrical supply 100 and the electrical load 104 of phases 114 and 116. The third phase 118 is directly connected to the resistance load 104. The externally generated logic signal 106 is received by logic conditioning circuit module 108. The external logic source 106 produces a 110 V 60 cycle single phase signal when thermostatic conditions demand additional heat. The logic conditioning circuit 108 modifies the signal to one acceptable to switch the SCRs. The logic conditioning circuit 108 consists of a step-down resistor 120 and a diode 122 which rectifies and reduces the voltage of the external logic signal producing a signal consisting of the positive half cycle only. This signal is then conditioned by a zener diode 124 and capacitor 126 connected in parallel to produce a regulated level DC voltage across logic conditioning module terminals 126 and 128. The logic conditioning module terminals 126 and 128 are connected in parallel to the terminals 40a, 40b, 40c, and 40d of the SCR modules 16 and 18 as shown. The SCR modules 16 and 18 include a photo-couplng 110, a zero cross switching circuit 112, and a pair of inverse parallel connected SCRs 102. The photo coupling 110 and the zero cross switching circuit 112 are featured circuits of the CRYDOM D2440 solid state relay.

Figure 3:
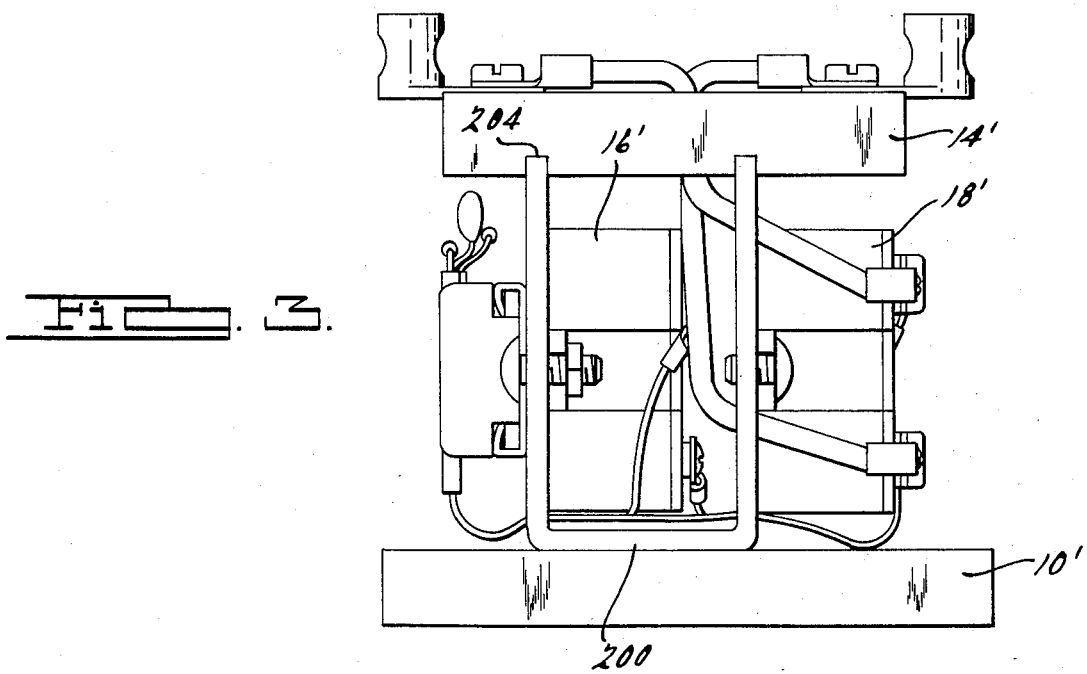
FIG. 3 is a side view of an alternative embodiment of the the present invention.
Figure 3:
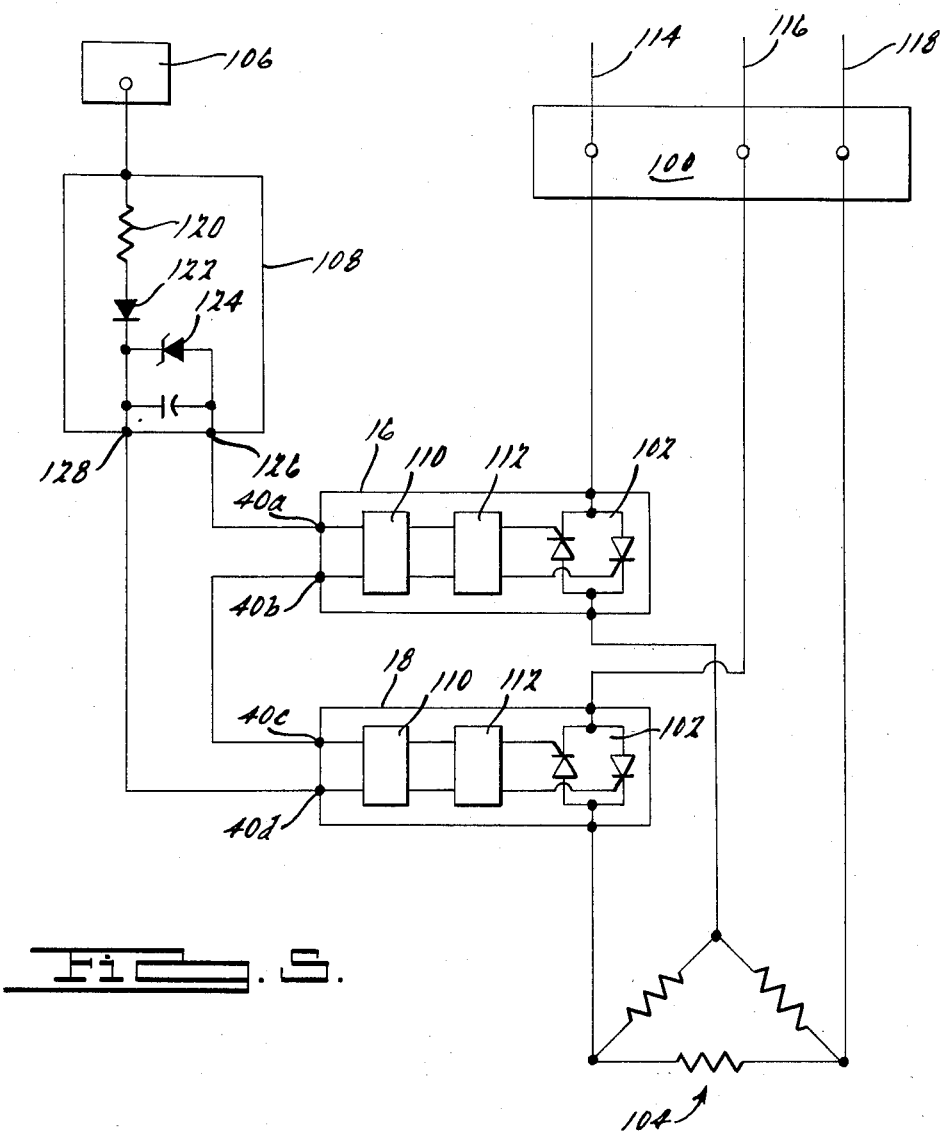

In another embodiment as shown in FIG. 3, the top member 14' is connected to the bottom member 10' by a "U" shaped channel section upon which the SCR modules 16' and 18' may be attached. The "U" shaped channel section 200 may be formed by an extrusion process or by a press brake. The "U" shaped channel section 200 is attached to the base by fasteners 202. The topmost portions of the "U" shaped channel section 200 are attached to routed slots 204 cut into the bottom surface of the top member 14' and secured thereto by epoxy or other suitable adhesive (not shown).

It is contemplated that many variations in shape, size, and in the materials which can be used are within the spirit of the invention disclosed in the above specification. Accordingly, it is to be understood that the scope of the present invention is not to be limited by the specific illustrative examples shown and described herein but rather by the scope of the language of the appended claims.

What is claimed is:

1. A three-phase electrical switching apparatus comprising, a generally rectangular bottom member, a top member constructed from an electrically non-conductive material, said top and said bottom members being separated and maintained in generally parallel places by connection to at least two parallel support members oriented generally perpendicular to said top and said bottom, a first and a second pair of inverse parallel connected silicon control rectifiers electrically connected respectively between a first and a second phase of an electrical power supply and a first and a second phase of an electrical load, a third phase of said power supply being connected to a third phase of said electrical load, said first pair of silicon control rectifiers being releasably secured to a first of said parallel support members and said second pair of silicon control rectifiers being releasably secured to a second of said parallel support members, said silicon control rectifiers having a switching means which is responsive to and electrically connected with an external logic source, said two parallel support members and said bottom member being constructed from a heat conductive material, and said electrical power supply, said electrical load and said external logic source being releasably connected to components of said apparatus by terminals releasably secured to said top member.

2. The apparatus as in claim 1 wherein said support members are a pair of C-section channel members oriented back-to-back and separated by an air gap.

3. The apparatus as in claim 1 wherein said switching means for said silicon control rectifiers includes a logic conditioning circuit which produces an electrical signal as required to switch said silicon control rectifiers when an external logic signal is applied thereto.

4. The apparatus as in claim 1 wherein said external logic signal is electrically isolated from said silicon control rectifiers by a photo isolation coupling.

5. The apparatus as in claim 1 wherein said means includes a zero cross circuit which switches said silicon control rectifiers when the instantaneous value of the amplitude of the supply voltage in the respective phases is zero.

6. The apparatus as in claim 1 wherein said switching means includes a logic conditioning circuit which produces an electrical signal as required to switch said silicon control rectifiers when an external logic signal is applied thereto, a photo isolation coupling, and a switching circuit which switches said silicon control rectifiers when the instantaneous value of the amplitude of the supply voltage in the respective phases is zero.

7. The apparatus of the present invention as in claim 1 wherein said support members are a single U-channel section having a bottommost portion of the U-channel section secured to the bottom plate and the top two portions of the U-channel section secured within parallel slots formed within the bottom surface of said top member.

* * * * *

UNITED STATES PATENT AND TRADEMARK OFFICE
CERTIFICATE OF CORRECTION

PATENT NO. : 4,618,817
DATED : October 21, 1986
INVENTOR(S) : ROGER A. HOLTSLANDER It is certified that error appears in the above-identified patent and that said Letters Patent is hereby corrected as shown below:

Column 3, line 5, delete "29" and insert therefor --28--

Column 3, line 60, delete "cirucit" and insert therefor --circuit--

Column 3, line 67, delete "pahase" and insert therefor --phase--

Column 4, line 21, delete "photo-couplng" and insert therefor --photo-coupling--

Column 4, line 50, Claim 1, delete "places" and insert therefor --planes--

Signed and Sealed this

Twenty-eighth Day of April, 1987

Attest:

DONALD J. QUIGG

Attesting Officer

Commissioner of Patents and Trademarks